(12) United States Patent
Liao et al.

(10) Patent No.: US 10,665,466 B2
(45) Date of Patent: *May 26, 2020

(54) METHOD FOR FORMING SEMICONDUCTOR DEVICE STRUCTURE

(71) Applicant: Taiwan Semiconductor Manufacturing Co., Ltd., Hsinchu (TW)

(72) Inventors: Keng-Ying Liao, Tainan (TW); Chung-Bin Tseng, Tainan (TW); Po-Zen Chen, Tainan (TW); Yi-Hung Chen, Kaohsiung (TW); Yi-Jie Chen, Tainan (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/219,835

(22) Filed: Dec. 13, 2018

(65) Prior Publication Data

US 2019/0115222 A1    Apr. 18, 2019

Related U.S. Application Data

(63) Continuation of application No. 15/444,039, filed on Feb. 27, 2017, now Pat. No. 10,163,646, which is a (Continued)

(51) Int. Cl.
*H01L 21/3065* (2006.01)
*H01L 21/308* (2006.01)
(Continued)

(52) U.S. Cl.
CPC ...... *H01L 21/3065* (2013.01); *H01L 21/0276* (2013.01); *H01L 21/0337* (2013.01);
(Continued)

(58) Field of Classification Search
None
See application file for complete search history.

(56) References Cited

U.S. PATENT DOCUMENTS 5,866,448 A * 2/1999 Pradeep .......... H01L 21/823814
257/E21.634
5,994,226 A   11/1999 Kadomura
(Continued)

*Primary Examiner* — Jiong-Ping Lu
(74) *Attorney, Agent, or Firm* — Haynes and Boone, LLP

(57) ABSTRACT

A method for forming a semiconductor device structure is provided. The semiconductor device structure includes forming a film over a substrate. The semiconductor device structure includes forming a first mask layer over the film. The semiconductor device structure includes forming a second mask layer over the first mask layer. The second mask layer exposes a first portion of the first mask layer. The semiconductor device structure includes performing a plasma etching and deposition process to remove the first portion of the first mask layer and to form a protection layer over a first sidewall of the second mask layer. The first mask layer exposes a second portion of the film after the plasma etching and deposition process. The semiconductor device structure includes removing the second portion using the first mask layer and the second mask layer as an etching mask.

20 Claims, 12 Drawing Sheets

Related U.S. Application Data continuation of application No. 14/871,256, filed on Sep. 30, 2015, now Pat. No. 9,583,356.

(51) Int. Cl.
| | | |
|---|---|---|
| *H01L 21/311* | (2006.01) | |
| *H01L 21/3213* | (2006.01) | |
| *H01L 21/027* | (2006.01) | |
| *H01L 21/033* | (2006.01) | |
| *H01L 29/66* | (2006.01) | |
| *H01L 21/28* | (2006.01) | |
| *H01L 29/78* | (2006.01) | |

(52) U.S. Cl.
CPC .. *H01L 21/28035* (2013.01); *H01L 21/28123* (2013.01); *H01L 21/3081* (2013.01); *H01L 21/3085* (2013.01); *H01L 21/31127* (2013.01); *H01L 21/31138* (2013.01); *H01L 21/31144* (2013.01); *H01L 21/32137* (2013.01); *H01L 21/32139* (2013.01); *H01L 29/66568* (2013.01); *H01L 29/66575* (2013.01); *H01L 29/78* (2013.01)

(56) References Cited

U.S. PATENT DOCUMENTS

| | | |
|---|---|---|
| 6,258,726 B1 | 7/2001 | Park et al. |
| 6,774,044 B2 | 8/2004 | Ke et al. |
| 6,955,964 B2 | 10/2005 | Haselden et al. |
| 7,858,270 B2 | 12/2010 | Stamper et al. |
| 8,294,207 B2 | 10/2012 | Cho et al. |
| 10,163,646 B2 * | 12/2018 | Liao .................... H01L 21/3065 |
| 2008/0292973 A1 * | 11/2008 | Stamper .............. H01L 21/0332 430/5 |
| 2009/0206403 A1 | 8/2009 | Wang et al. |
| 2015/0318287 A1 | 11/2015 | Sugino |

* cited by examiner

METHOD FOR FORMING SEMICONDUCTOR DEVICE STRUCTURE

CROSS-REFERENCE TO RELATED APPLICATION

This application is a continuation application of U.S. application Ser. No. 15/444,039, filed Feb. 27, 2017, now U.S. Pat. No. 10,163,646, which is a continuation application of U.S. application Ser. No. 14/871,256, filed Sep. 30, 2015, now U.S. Pat. No. 9,583,356, the entirety of each are hereby incorporated by reference.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
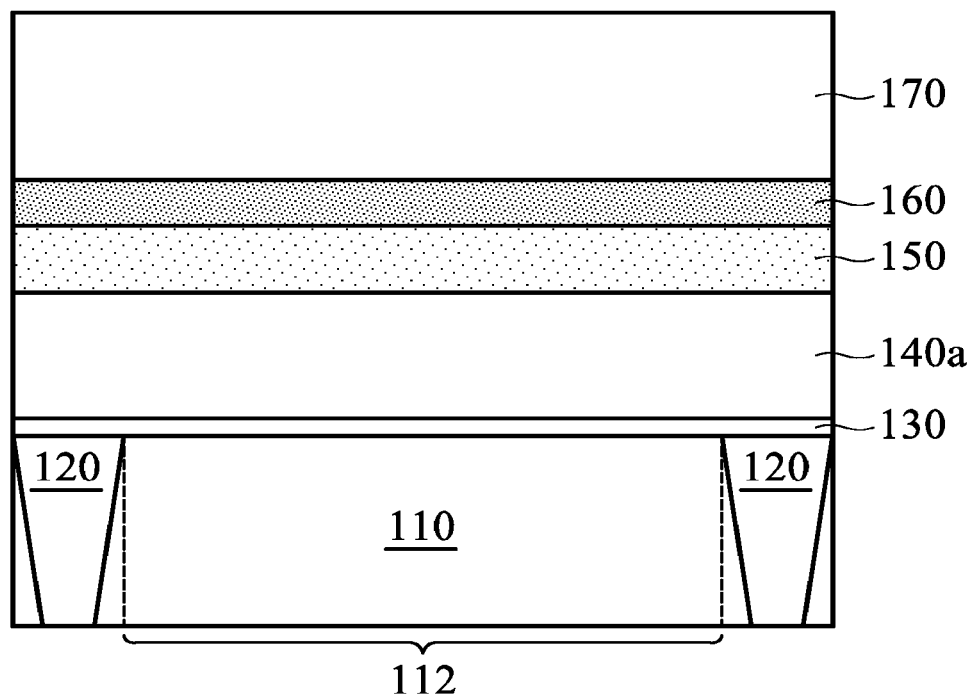
FIGS. 1A-1H are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIGS. 1A-1H are cross-sectional views of various stages of a process for forming a semiconductor device structure, in accordance with some embodiments. FIG. 2 is a top view of the semiconductor device structure of FIG. 1C, in accordance with some embodiments. As shown in FIG. 1A, a substrate 110 is provided. The substrate 110 includes a semiconductor wafer (such as a silicon wafer) or a portion of a semiconductor wafer, in accordance with some embodiments.

In some embodiments, the substrate 110 is made of an elementary semiconductor material including silicon or germanium in a single crystal, polycrystal, or amorphous structure. In some other embodiments, the substrate 110 is made of a compound semiconductor, such as silicon carbide, gallium arsenide, gallium phosphide, indium phosphide, indium arsenide, an alloy semiconductor, such as SiGe, or GaAsP, or combinations thereof. The substrate 110 may also include multi-layer semiconductors, semiconductor on insulator (SOI) (such as silicon on insulator or germanium on insulator), or combinations thereof.

As shown in FIG. 1A, an isolation structure 120 is formed in the substrate 110 to define various active regions 112 of the substrate 110, and to electrically isolate neighboring devices (e.g. transistors) from one another. The isolation structure 120 surrounds the active regions 112.

The isolation structure 120 is made of a dielectric material, in accordance with some embodiments. The dielectric material includes silicon oxide, silicon nitride, silicon oxynitride, fluoride-doped silicate glass (FSG), a low-K dielectric material, other suitable materials, or combinations thereof, in accordance with some embodiments. The isolation structure 120 is formed by using an isolation technology, such as local oxidation of semiconductor (LOCOS), shallow trench isolation (STI), or the like, in accordance with some embodiments.

In some embodiments, the formation of the isolation structure 120 includes patterning the substrate 110 by a photolithography process, etching a trench in the substrate 110 (for example, by using a dry etching, wet etching, or plasma etching process, or a combination thereof), and filling the trench (for example, by using a chemical vapor deposition process) with the dielectric material. In some embodiments, the filled trench may have a multi-layer structure, such as a thermal oxide liner layer filled with silicon nitride or silicon oxide.

As shown in FIG. 1A, a gate dielectric layer 130 is formed over the substrate 110 and the isolation structure 120, in accordance with some embodiments. The gate dielectric layer 130 is made of silicon oxide, silicon oxynitride, a high dielectric constant material (high-k material), or a combination thereof, in accordance with some embodiments. The gate dielectric layer 130 is formed using a chemical vapor deposition process or a physical vapor deposition process, in accordance with some embodiments.

As shown in FIG. 1A, a gate material layer 140a is formed over the gate dielectric layer 130, in accordance with some embodiments. The gate material layer 140a is made of polysilicon or other suitable materials, in accordance with some embodiments. The gate material layer 140a is formed using a chemical vapor deposition process or a physical vapor deposition process, in accordance with some embodiments.

As shown in FIG. 1A, a film 150 is formed over the gate material layer 140a, in accordance with some embodiments. The film 150 is configured to be a hard mask layer during an etching process that is subsequently performed, in accordance with some embodiments. The film 150 includes silicon oxide, silicon nitride (e.g., Si3N4), SiON, SiC, SiOC, a combination thereof, or another suitable material, in accordance with some embodiments. The film 150 may be formed by chemical vapor deposition (CVD), physical vapor deposition (PVD), atomic layer deposition (ALD), spin-on coating, or other applicable processes.

As shown in FIG. 1A, an anti-reflection layer 160 is formed over the film 150, in accordance with some embodiments. The anti-reflection layer 160 is also referred to as a mask layer, in accordance with some embodiments. The anti-reflection layer 160 includes a polymer material (such as a bottom anti-reflective coating material) or another suitable material. The anti-reflection layer 160 is formed using a spin coating process or another suitable process.

As shown in FIG. 1A, a mask layer 170 is formed over the anti-reflection layer 160, in accordance with some embodiments. The mask layer 170 includes a polymer material (such as a photoresist material), in accordance with some embodiments. The mask layer 170 includes a photoresist layer, in accordance with some embodiments. The mask layer 170 is formed using a spin coating process or another suitable process. In some embodiments, the film 150, the anti-reflection layer 160, and the mask layer 170 are made of different materials.

Figure 1B:
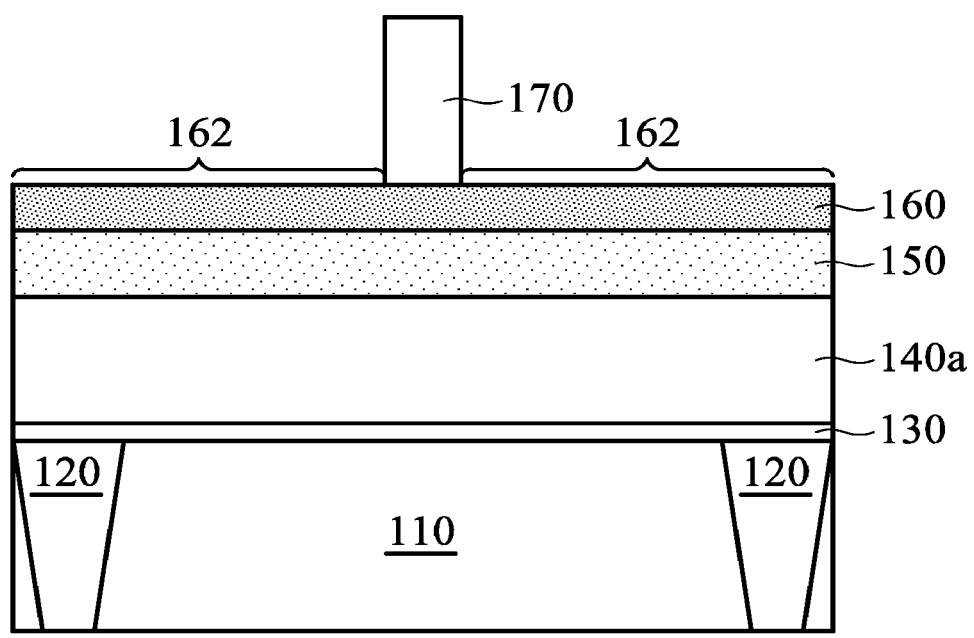
Figure 2:
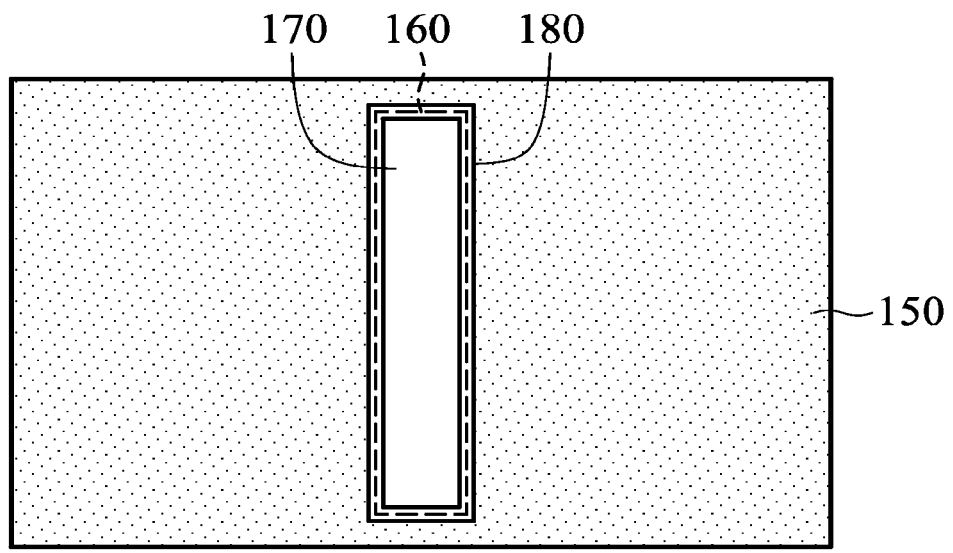
FIG. 2 is a top view of the semiconductor device structure of FIG. 1C.

As shown in FIG. 1B, a portion of the mask layer 170 is removed, in accordance with some embodiments. The removal process includes a photolithography process, in accordance with some embodiments. The mask layer 170 exposes a portion 162 of the anti-reflection layer 160, in accordance with some embodiments.

Figure 1C:
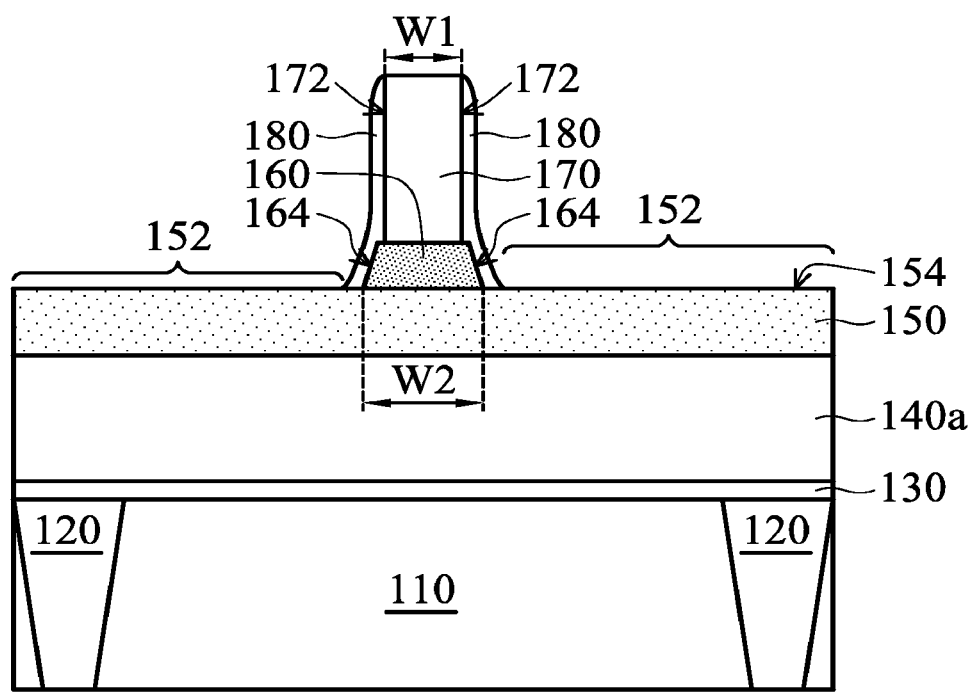

As shown in FIGS. 1C and 2, a plasma etching and deposition process is performed over the anti-reflection layer 160 and the mask layer 170, in accordance with some embodiments. The plasma etching and deposition process removes the portion 162 of the anti-reflection layer 160 and form a protection layer 180 over sidewalls 172 of the mask layer 170, in accordance with some embodiments.

The protection layer 180 is further formed over sidewalls 164 of the anti-reflection layer 160, in accordance with some embodiments. The protection layer 180 includes a polymer material, in accordance with some embodiments. In some embodiments, the protection layer 180 continuously covers the sidewalls 164 and 172.

The protection layer 180 surrounds the mask layer 170 and the anti-reflection layer 160, in accordance with some embodiments. The protection layer 180 continuously surrounds the mask layer 170 and the anti-reflection layer 160, in accordance with some embodiments. After the plasma etching and deposition process, the anti-reflection layer 160 and the protection layer 180 expose a portion 152 of the film 150, in accordance with some embodiments.

In some embodiments, the plasma etching and deposition process uses a processing gas. The processing gas is configured to be an etching gas and a polymer gas, in accordance with some embodiments. The polymer gas is configured to provide a polymer deposition during the plasma etching and deposition process, in accordance with some embodiments.

The processing gas includes $CHF_3$, $CH_2F_2$, $CH_3F$, or a combination thereof. The processing gas includes pure $CHF_3$ and unavoidable impurity gas(es), in accordance with some embodiments. The processing gas includes pure $CH_2F_2$ and unavoidable impurity gas(es), in accordance with some embodiments. The processing gas includes pure $CH_3F$ and unavoidable impurity gas(es), in accordance with some embodiments.

During the plasma etching and deposition process, an exposed portion of the mask layer 170 may be etched away. Since the protection layer 180 is formed over sidewalls 172 of the mask layer 170 during the plasma etching and deposition process, the protection layer 180 reduces the etching rate of the mask layer 170 adjacent to the sidewalls 172.

Therefore, the mask layer 170, which has been etched, is able to maintain the desired width W1, which is greater than that of the mask layer, which has been etched without the protection layer 180. Furthermore, the protection layer 180 over the sidewalls 172 may be an etching mask during the removal of the portion 162 of the anti-reflection layer 160.

As a result, the width W2 of the anti-reflection layer 160, which has been etched, is enlarged by the formation of the protection layer 180. Therefore, the anti-reflection layer 160, which has been etched, is able to have the desired width W2. The formation of the protection layer 180 prevents the critical dimension (e.g., the width W2) of the anti-reflection layer 160 from undesirable shrinkage. The formation of the protection layer 180 simplifies the design of the photomask used in the photolithography process of FIG. 1B, which reduces the cost of the photomask.

In some embodiments, the sidewalls 164 of the anti-reflection layer 160 are taper sidewalls. Therefore, the width W2 of the anti-reflection layer 160 increases toward the film 150, in accordance with some embodiments. As a result, the width W2 of the anti-reflection layer 160 is greater than the width W1 of the mask layer 170, in accordance with some embodiments. In some embodiments, the greatest width W2 of the anti-reflection layer 160 is greater than the width W1 of the mask layer 170.

The plasma etching and deposition process is performed using a bias power ranging from about 200 W to about 700 W, in accordance with some embodiments. The plasma etching and deposition process is performed at a pressure ranging from about 3 mTorr to about 10 mTorr, in accordance with some embodiments.

If the bias power is less than 200 W and the pressure is greater than 10 mTorr, the protection layer 180 may be not only formed over the sidewalls 164 and 172, but also formed over a top surface 154 of the portion 152, which hinders the removal process for removing the portion 152 of the film 150 performed subsequently. If the bias power is greater than 700 W and/or the pressure is less than 3 mTorr, the protection layer 180 is not formed or only partially-formed.

Figure 1D:
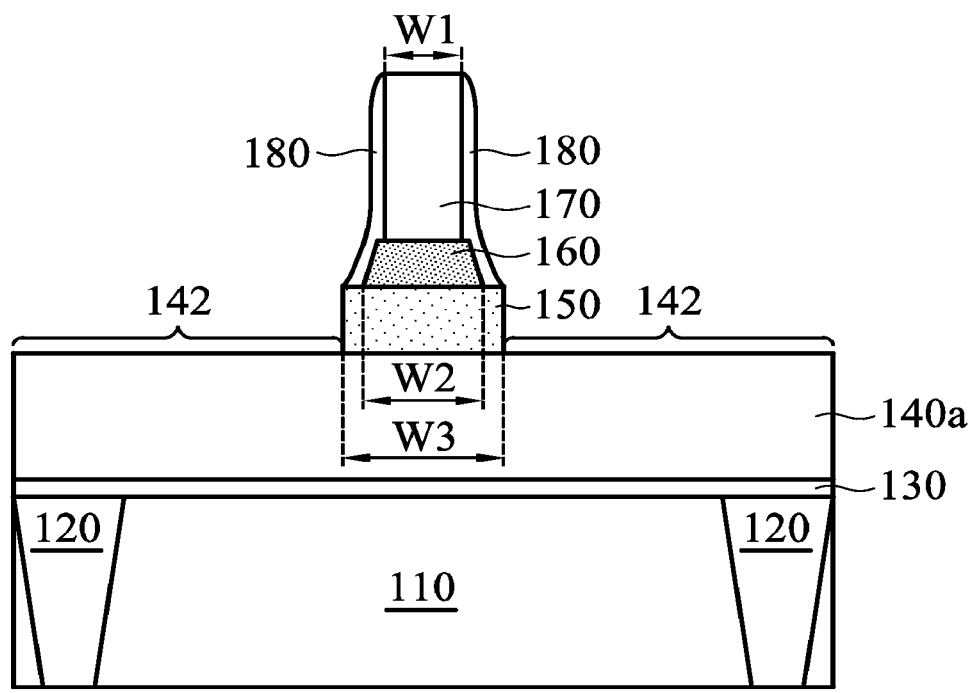

As shown in FIG. 1D, the portion 152 of the film 150 is removed using the mask layer 170 and the anti-reflection layer 160 as an etching mask, in accordance with some embodiments. In some embodiments, the protection layer 180 is also used as an etching mask during the removal process for removing the portion 152. The removal process includes a dry etching process, in accordance with some embodiments. After the removal process, the film 150 exposes a portion 142 of the gate material layer 140a, in accordance with some embodiments.

After the removal process, since the mask layer 170 and the anti-reflection layer 160 have the desired widths W1 and W2, the film 150 has the desired width W3. In some embodiments, the protection layer 180 enlarges the width W3. The formation of the protection layer 180 prevents the critical dimensions (e.g., the widths W2 and W3) of the anti-reflection layer 160 and the film 150 from undesirable shrinkage.

Figure 1E:
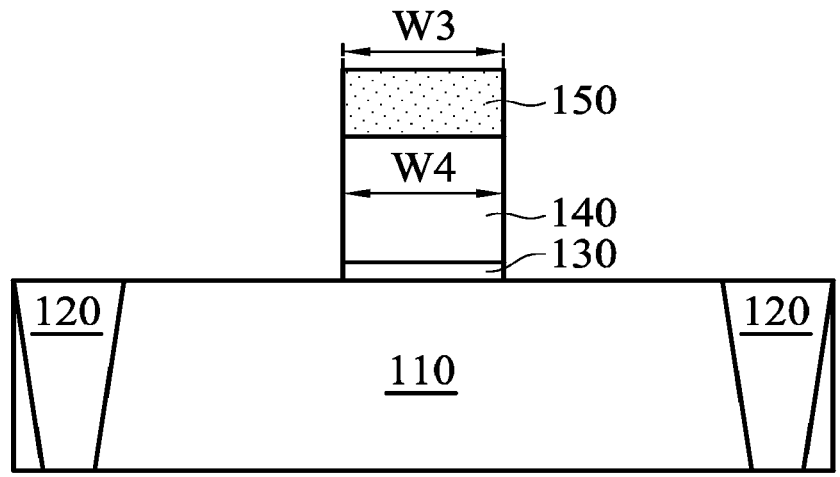

As shown in FIG. 1E, the mask layer 170, the anti-reflection layer 160, and the protection layer 180 are removed, in accordance with some embodiments. The mask layer 170, the anti-reflection layer 160, and the protection layer 180 are removed using a dry etching process, in accordance with some embodiments. As shown in FIG. 1E, the portion 142 of the gate material layer 140a is removed using the film 150 as an etching mask, in accordance with some embodiments.

After the removal process for removing the portion 142, the remaining portion of the gate material layer 140a forms a gate 140, in accordance with some embodiments. The removal process also removes a portion of the gate dielectric layer 130 under the portion 142, in accordance with some embodiments. The removal process includes a dry etching process, in accordance with some embodiments.

After the removal process, since the film 150 have the desired width W3, the gate 140 has the desired width W4, in accordance with some embodiments. As shown in FIGS. 1D-1E, the formation of the protection layer 180 prevents the critical dimensions (e.g., the widths W2, W3, and W4) of the anti-reflection layer 160, the film 150, and the gate 140 from undesirable shrinkage.

Figure 1F:
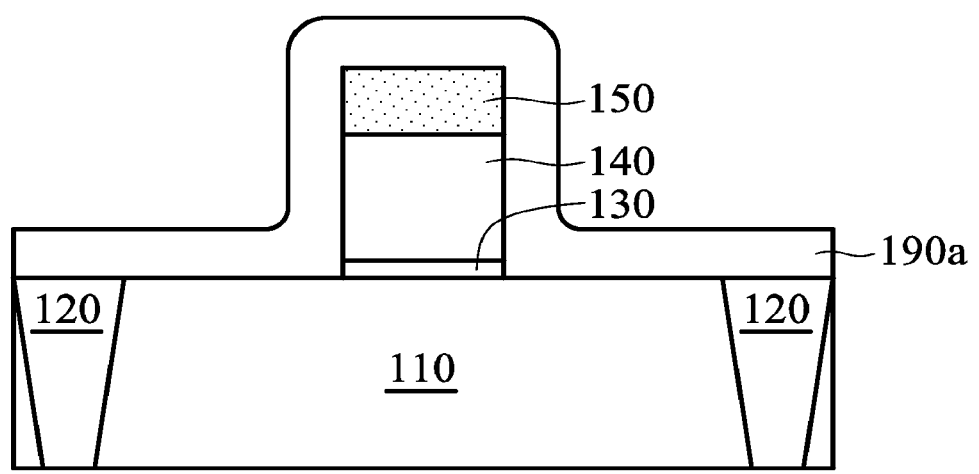

As shown in FIG. 1F, a spacer layer 190a is formed over the substrate 110, the isolation structure 120, the gate dielectric layer 130, the gate 140, and the film 150, in accordance with some embodiments. The spacer layer 190a includes an insulating material, such as silicon oxide or silicon nitride. The spacer layer 190a is formed using a chemical vapor deposition process, in accordance with some embodiments.

Figure 1G:
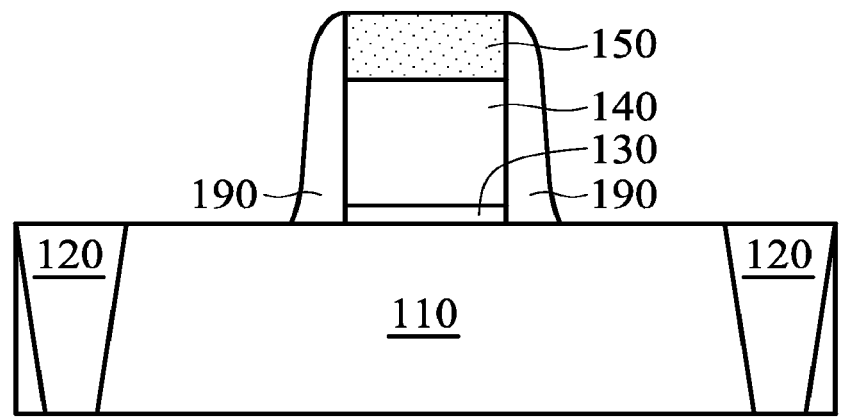

As shown in FIG. 1G, an anisotropic etching process is performed to remove a portion of the spacer layer 190a, in accordance with some embodiments. The spacer layer 190a remaining over the sidewalls of the gate dielectric layer 130, the gate 140, and the film 150 forms spacers 190, in accordance with some embodiments. The spacers 190 are configured to electrically isolate a gate formed subsequently from other devices and configured to act as a mask layer in a subsequent ion implantation process, in accordance with some embodiments. The anisotropic etching process includes a dry etching process, in accordance with some embodiments.

Figure 1H:
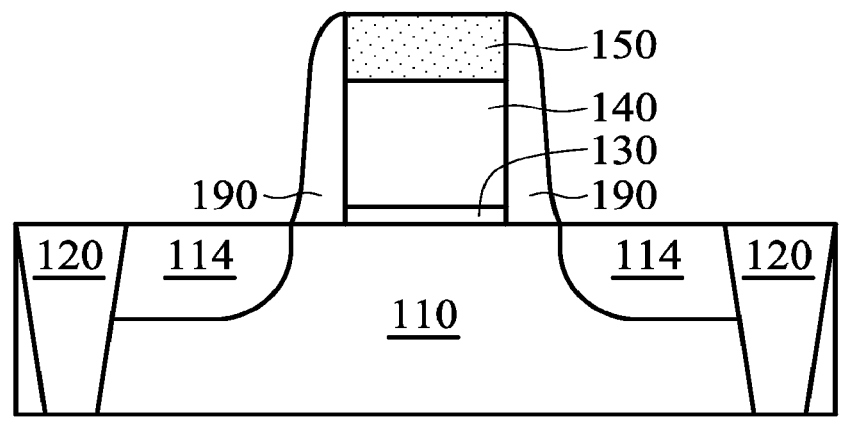

As shown in FIG. 1H, heavily doped regions 114 are formed in the substrate 110, in accordance with some embodiments. The heavily doped regions 114 are formed using an ion implantation process, in accordance with some embodiments. The ion implantation process is performed to introduce p-type impurities (e.g., boron) or n-type impurities (e.g., phosphorus) into the substrate 110, in accordance with some embodiments.

The heavily doped regions 114 are a heavily doped source region and a heavily doped drain region, in accordance with some embodiments. The heavily doped regions 114 are located at the two opposite sides of the gate 140, in accordance with some embodiments.

If the thickness of the protection layer 180 is greater than the desired thickness, the protection layer 180 may be thinned or removed. The detailed description is exemplary described as follows.

Figure 3A:
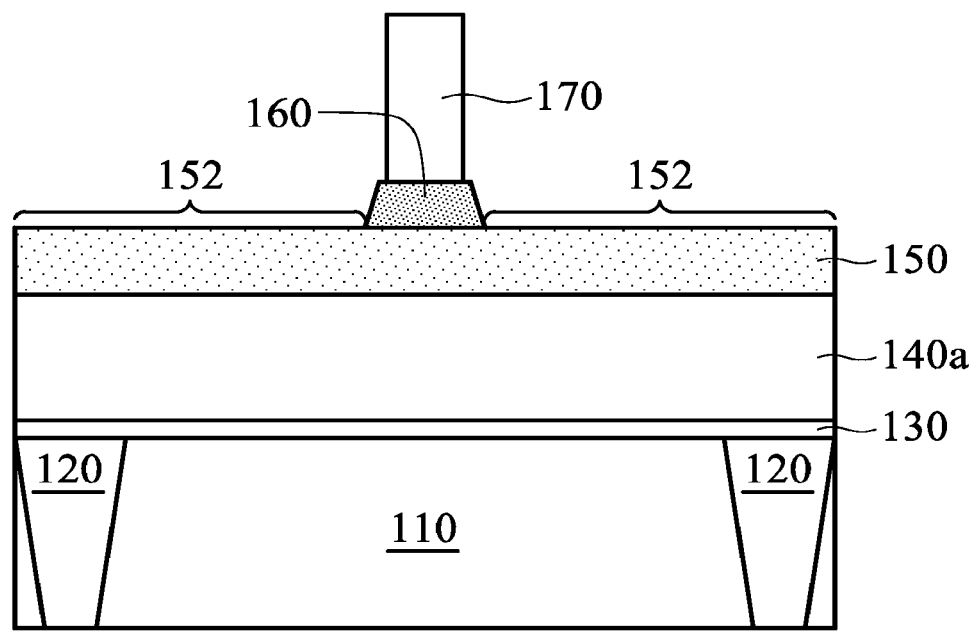
FIGS. 3A-3F are cross-sectional views of various stages of a process for forming a semiconductor device structure, in accordance with some embodiments.

FIGS. 3A-3F are cross-sectional views of various stages of a process for forming a semiconductor device structure, in accordance with some embodiments. After the step of FIG. 1C, as shown in FIG. 3A, the protection layer 180 is removed, in accordance with some embodiments. The removal process includes a dry etching process, in accordance with some embodiments. After the removal process, the anti-reflection layer 160 exposes a portion 152 of the film 150, in accordance with some embodiments.

Figure 3B:
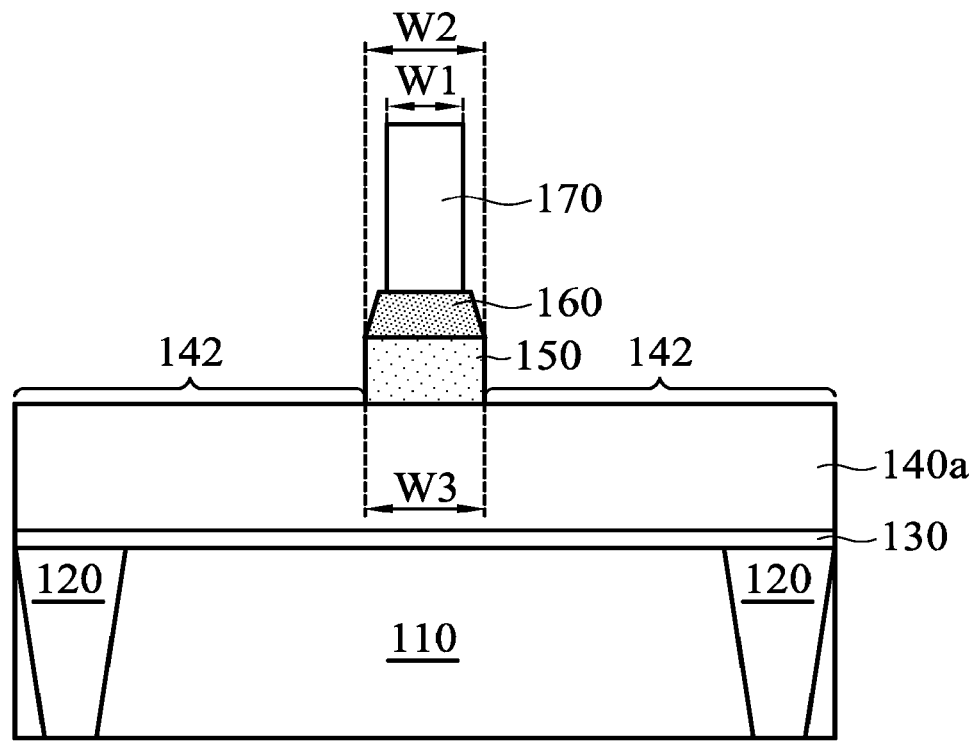

As shown in FIG. 3B, the portion 152 of the film 150 is removed using the mask layer 170 and the anti-reflection layer 160 as an etching mask, in accordance with some embodiments. The removal process includes a dry etching process, in accordance with some embodiments. After the removal process, the film 150 exposes a portion 142 of the gate material layer 140a, in accordance with some embodiments.

After the removal process, since the mask layer 170 and the anti-reflection layer 160 have the desired widths W1 and W2, the film 150 has the desired width W3. As shown in FIGS. 1C and 3A-3B, the formation of the protection layer 180 prevents the critical dimensions (e.g., the widths W2 and W3) of the anti-reflection layer 160 and the film 150 from undesirable shrinkage.

Figure 3C:
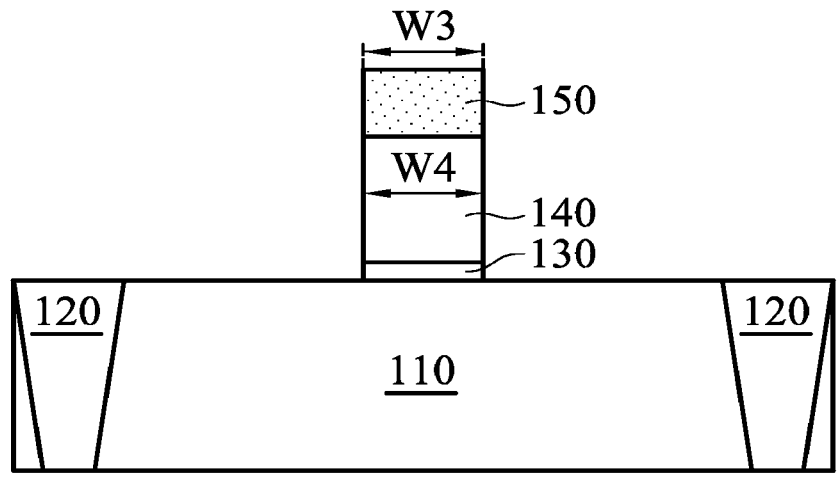

As shown in FIG. 3C, the mask layer 170 and the anti-reflection layer 160 are removed, in accordance with some embodiments. The mask layer 170 and the anti-reflection layer 160 are removed using a dry etching process, in accordance with some embodiments. As shown in FIG. 3C, the portion 142 of the gate material layer 140a is removed using the film 150 as an etching mask, in accordance with some embodiments.

After the removal process for removing the portion 142, the remaining portion of the gate material layer 140a forms a gate 140, in accordance with some embodiments. The removal process also removes a portion of the gate dielectric layer 130 under the portion 142, in accordance with some embodiments. The removal process includes a dry etching process, in accordance with some embodiments.

After the removal process, since the film 150 have the desired width W3, the gate 140 has the desired width W4, in accordance with some embodiments. As shown in FIGS. 1C and 3A-3C, the formation of the protection layer 180 prevents the critical dimensions (e.g., the widths W2, W3, and W4) of the anti-reflection layer 160, the film 150, and the gate 140 from undesirable shrinkage.

Figure 3D:
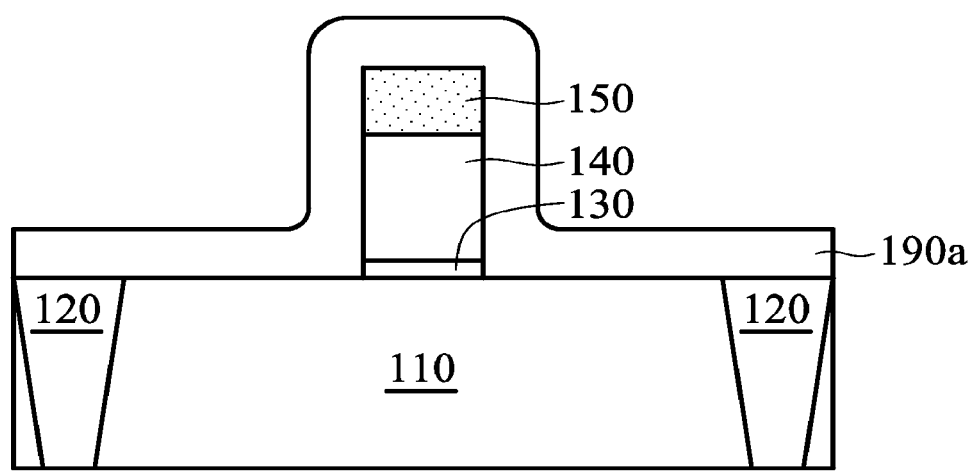

As shown in FIG. 3D, a spacer layer 190a is formed over the substrate 110, the isolation structure 120, the gate dielectric layer 130, the gate 140, and the film 150, in accordance with some embodiments. The spacer layer 190a includes an insulating material, such as silicon oxide or silicon nitride. The spacer layer 190a is formed using a chemical vapor deposition process, in accordance with some embodiments.

Figure 3E:
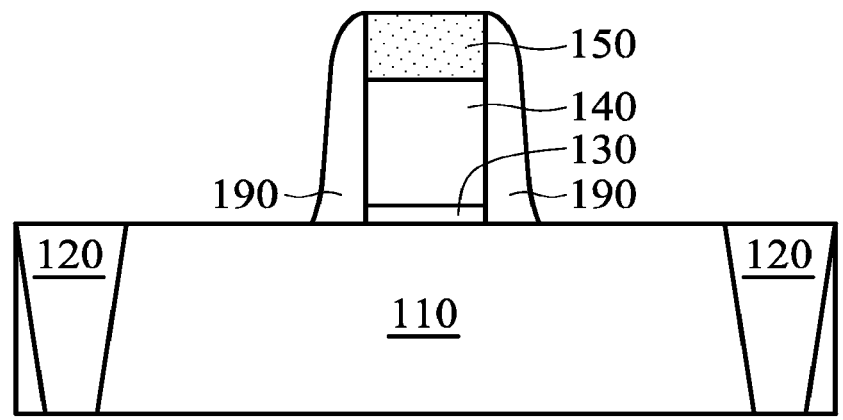

As shown in FIG. 3E, an anisotropic etching process is performed to remove a portion of the spacer layer 190a, in accordance with some embodiments. The spacer layer 190a remaining over the sidewalls of the gate dielectric layer 130, the gate 140, and the film 150 forms spacers 190, in accordance with some embodiments. The spacers 190 are configured to electrically isolate a gate formed subsequently from other devices and configured to act as a mask layer in a subsequent ion implantation process, in accordance with some embodiments. The anisotropic etching process includes a dry etching process, in accordance with some embodiments.

Figure 3F:
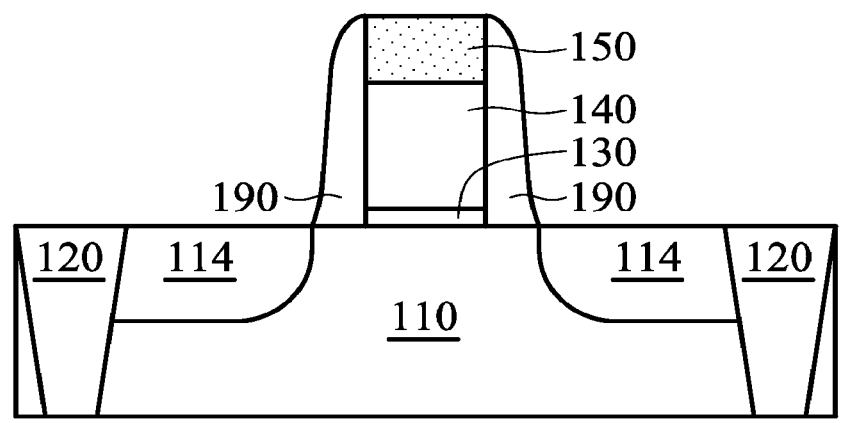

As shown in FIG. 3F, heavily doped regions 114 are formed in the substrate 110, in accordance with some embodiments. The heavily doped regions 114 are formed using an ion implantation process, in accordance with some embodiments. The ion implantation process is performed to introduce p-type impurities (e.g., boron) or n-type impurities (e.g., phosphorus) into the substrate 110, in accordance with some embodiments.

The heavily doped regions 114 are a heavily doped source region and a heavily doped drain region, in accordance with some embodiments. The heavily doped regions 114 are located at the two opposite sides of the gate 140, in accordance with some embodiments.

FIGS. 4A-4G are cross-sectional views of various stages of a process for forming a semiconductor device structure, in accordance with some embodiments. FIG. 5 is a top view of the semiconductor device structure of FIG. 4A, in accordance with some embodiments.

Figure 4A:
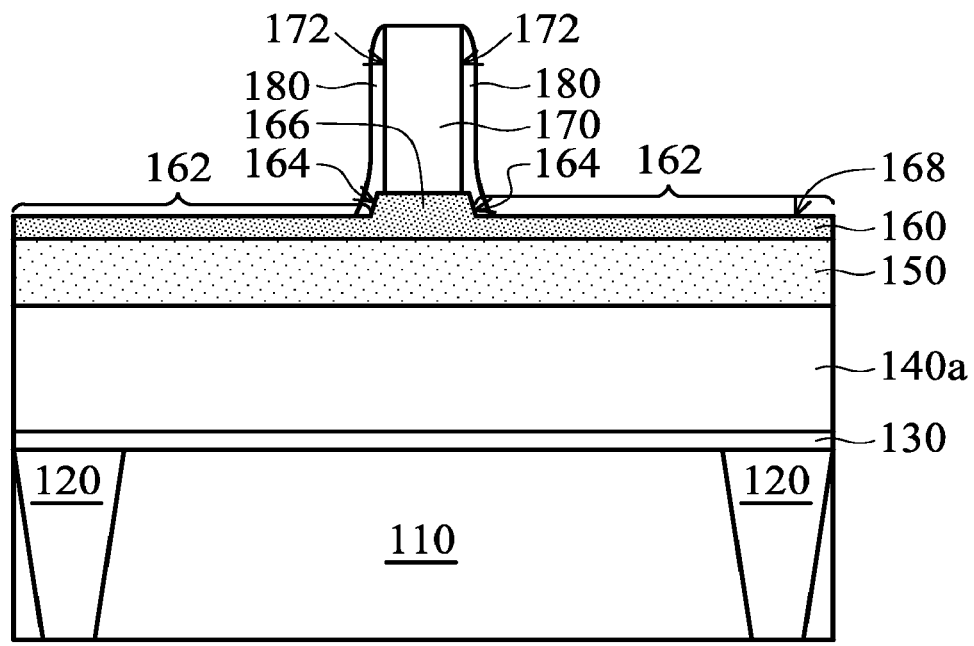
FIGS. 4A-4G are cross-sectional views of various stages of a process for forming a semiconductor device structure, in accordance with some embodiments.
Figure 5:
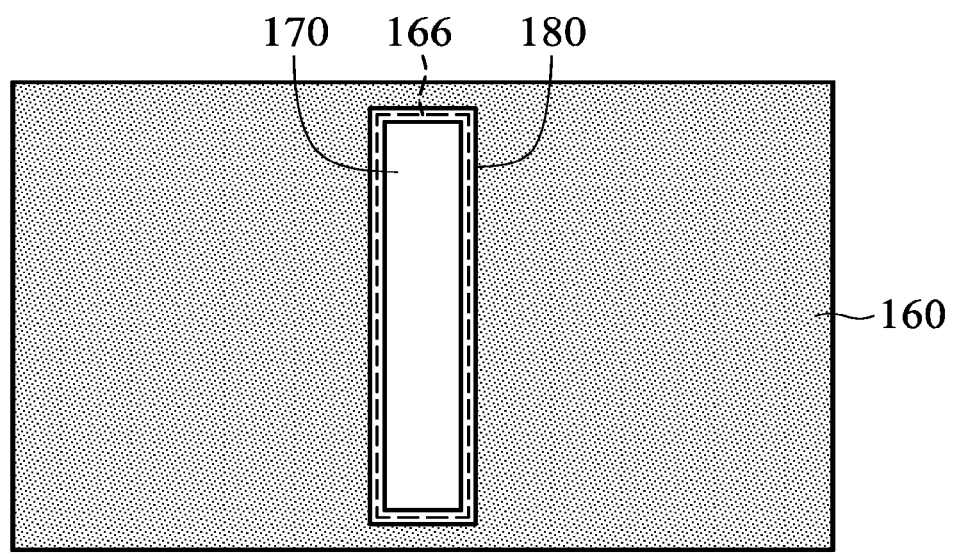
FIG. 5 is a top view of the semiconductor device structure of FIG. 4A.

After the step of FIG. 1B, as shown in FIGS. 4A and 5, a plasma etching and deposition process is performed over the anti-reflection layer 160 and the mask layer 170, in accordance with some embodiments. The plasma etching and deposition process thins out the portion 162 of the anti-reflection layer 160 and form a protection layer 180 over sidewalls 172 of the mask layer 170, in accordance with some embodiments.

After the plasma etching and deposition process, the anti-reflection layer 160 has a portion 166 under the mask layer 170, in accordance with some embodiments. The portion 166 protrudes from an upper surface 168 of the portion 162 that is thinned out, in accordance with some embodiments. The portion 166 has sidewalls 164, in accordance with some embodiments.

The protection layer 180 is formed further over the sidewalls 164 of the portion 166, in accordance with some embodiments. The protection layer 180 covers the sidewalls 164 of the portion 166, in accordance with some embodiments. The protection layer 180 includes a polymer material, in accordance with some embodiments. In some embodiments, the protection layer 180 continuously covers the sidewalls 164 and 172. The protection layer 180 surrounds the mask layer 170 and the portion 166, in accordance with some embodiments. The protection layer 180 continuously surrounds the mask layer 170 and the portion 166, in accordance with some embodiments.

In some embodiments, the plasma etching and deposition process uses a processing gas. The processing gas is configured to be an etching gas and a polymer gas, in accordance with some embodiments. The polymer gas is configured to provide a polymer deposition during the plasma etching and deposition process, in accordance with some embodiments.

The processing gas includes $CHF_3$, $CH_2F_2$, $CH_3F$, or a combination thereof. The processing gas includes pure $CHF_3$ and unavoidable impurity gas(es), in accordance with some embodiments. The processing gas includes pure $CH_2F_2$ and unavoidable impurity gas(es), in accordance with some embodiments. The processing gas includes pure $CH_3F$ and unavoidable impurity gas(es), in accordance with some embodiments.

Figure 4B:
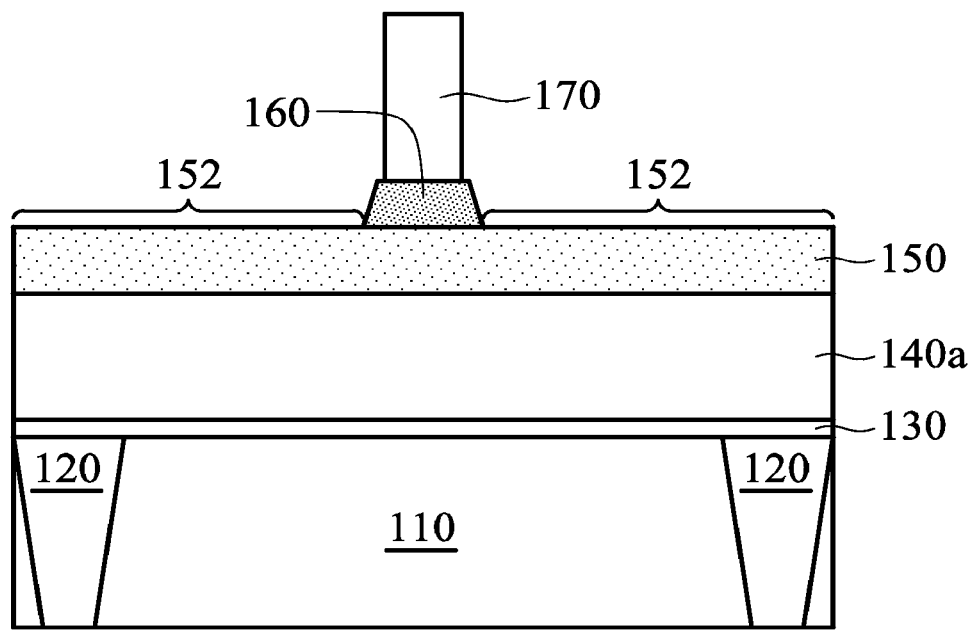

As shown in FIG. 4B, the protection layer 180 and the portion 162 of the mask layer 160 are removed, in accordance with some embodiments. After the removal process, the anti-reflection layer 160 exposes a portion 152 of the film 150, in accordance with some embodiments. The removal process includes a dry etching process, in accordance with some embodiments.

Figure 4C:
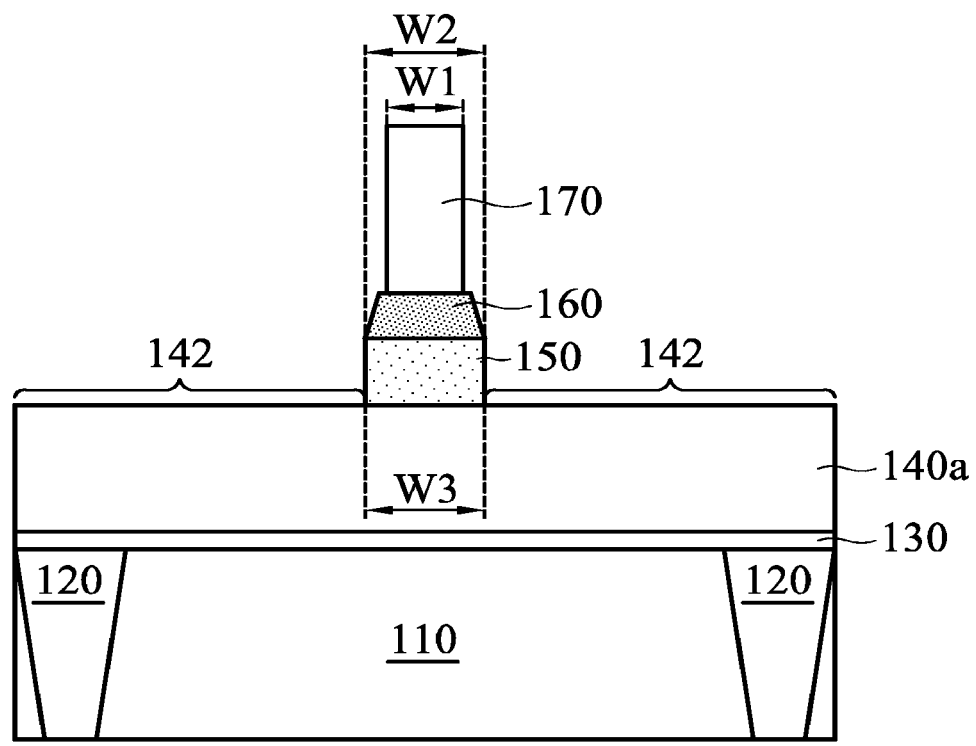

As shown in FIG. 4C, the portion 152 of the film 150 is removed using the mask layer 170 and the anti-reflection layer 160 as an etching mask, in accordance with some embodiments. The removal process includes a dry etching process, in accordance with some embodiments. After the removal process, the film 150 exposes a portion 142 of the gate material layer 140a, in accordance with some embodiments.

After the removal process, since the mask layer 170 and the anti-reflection layer 160 have the desired widths W1 and W2, the film 150 has the desired width W3. As shown in FIGS. 4A-4C, the formation of the protection layer 180 prevents the critical dimensions (e.g., the widths W2 and W3) of the anti-reflection layer 160 and the film 150 from undesirable shrinkage.

Figure 4D:
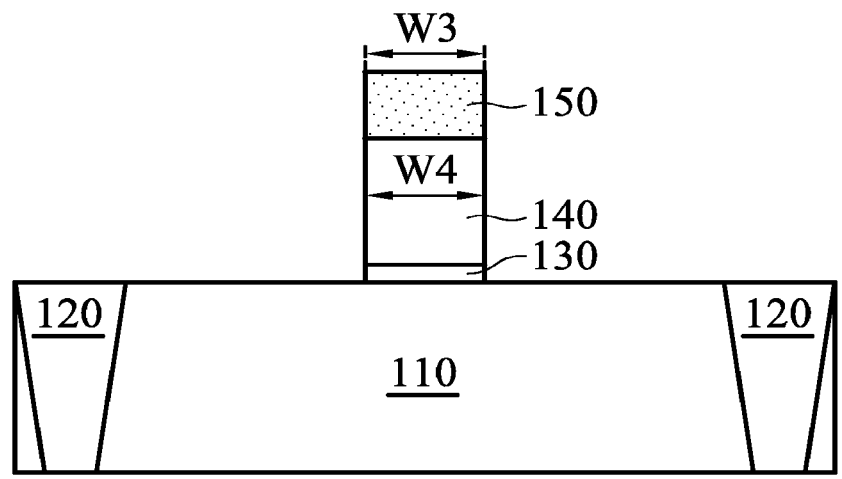

As shown in FIG. 4D, the mask layer 170 and the anti-reflection layer 160 are removed, in accordance with some embodiments. The mask layer 170 and the anti-reflection layer 160 are removed using a dry etching process, in accordance with some embodiments. As shown in FIG. 4D, the portion 142 of the gate material layer 140a is removed using the film 150 as an etching mask, in accordance with some embodiments.

After the removal process for removing the portion 142, the remaining portion of the gate material layer 140a forms a gate 140, in accordance with some embodiments. The removal process also removes a portion of the gate dielectric layer 130 under the portion 142, in accordance with some embodiments. The removal process includes a dry etching process, in accordance with some embodiments.

After the removal process, since the film 150 have the desired width W3, the gate 140 has the desired width W4, in accordance with some embodiments. As shown in FIGS. 4A-4D, the formation of the protection layer 180 prevents the critical dimensions (e.g., the widths W2, W3, and W4) of the anti-reflection layer 160, the film 150, and the gate 140 from undesirable shrinkage.

Figure 4E:
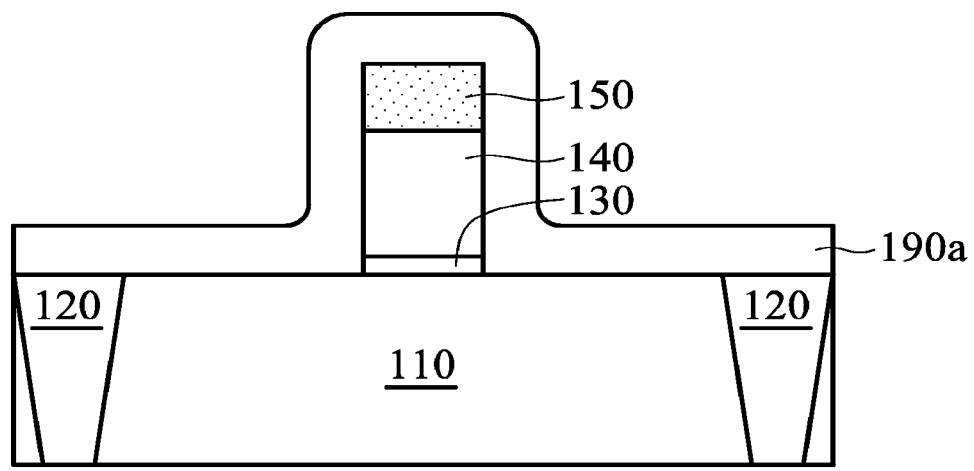

As shown in FIG. 4E, a spacer layer 190a is formed over the substrate 110, the isolation structure 120, the gate dielectric layer 130, the gate 140, and the film 150, in accordance with some embodiments. The spacer layer 190a includes an insulating material, such as silicon oxide or silicon nitride. The spacer layer 190a is formed using a chemical vapor deposition process, in accordance with some embodiments.

Figure 4F:
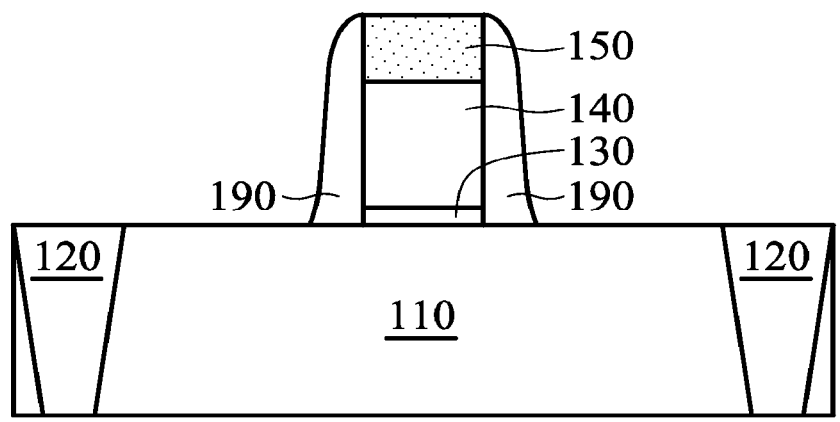

As shown in FIG. 4F, an anisotropic etching process is performed to remove a portion of the spacer layer 190a, in accordance with some embodiments. The spacer layer 190a remaining over the sidewalls of the gate dielectric layer 130, the gate 140, and the film 150 forms spacers 190, in accordance with some embodiments. The spacers 190 are configured to electrically isolate a gate formed subsequently from other devices and configured to act as a mask layer in a subsequent ion implantation process, in accordance with some embodiments. The anisotropic etching process includes a dry etching process, in accordance with some embodiments.

Figure 4G:
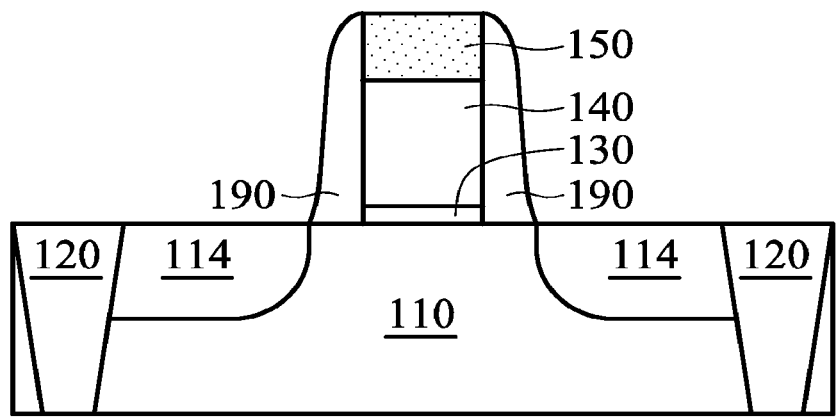

As shown in FIG. 4G, heavily doped regions 114 are formed in the substrate 110, in accordance with some embodiments. The heavily doped regions 114 are formed using an ion implantation process, in accordance with some embodiments. The ion implantation process is performed to introduce p-type impurities (e.g., boron) or n-type impurities (e.g., phosphorus) into the substrate 110, in accordance with some embodiments.

The heavily doped regions 114 are a heavily doped source region and a heavily doped drain region, in accordance with some embodiments. The heavily doped regions 114 are located at the two opposite sides of the gate 140, in accordance with some embodiments.

In accordance with some embodiments, methods for forming semiconductor device structures are provided. The methods (for forming the semiconductor device structure) perform a plasma etching and deposition process to remove a portion of a first mask layer exposed by a second mask layer and to form a protection layer over a sidewall of the second mask layer. The protection layer is able to substantially maintain a critical dimension of the second mask layer during the plasma etching and deposition process. Therefore, the first mask layer, which has been etched, has a desired critical dimension. As a result, the methods improve the process yield.

In accordance with some embodiments, a method for forming a semiconductor device structure is provided. The method includes forming a film over a substrate. The method includes forming a first mask layer over the film. The method includes forming a second mask layer over the first mask layer. The second mask layer exposes a first portion of the first mask layer. The method includes performing a plasma etching and deposition process to remove the first portion of the first mask layer and to form a protection layer over a first sidewall of the second mask layer. The first mask layer exposes a second portion of the film after the plasma etching and deposition process. The method includes removing the second portion using the first mask layer and the second mask layer as an etching mask.

In accordance with some embodiments, a method for forming a semiconductor device structure is provided. The method includes forming a film over a substrate. The method includes forming a first mask layer over the film. The method includes forming a second mask layer over the first mask layer. The second mask layer exposes a first portion of the first mask layer. The method includes performing a plasma etching and deposition process to remove the first portion of the first mask layer and to form a protection layer over a first sidewall of the second mask layer. The first mask layer exposes a second portion of the film after the plasma etching and deposition process. The method includes removing the protection layer. The method includes removing the second portion of the film using the first mask layer and the second mask layer as an etching mask.

In accordance with some embodiments, a method for forming a semiconductor device structure is provided. The method includes forming a film over a substrate. The method includes forming a first mask layer over the film. The method includes forming a second mask layer over the first mask layer. The second mask layer exposes a first portion of the first mask layer. The method includes performing a plasma etching and deposition process to thin out the first portion of the first mask layer and to form a protection layer over a first sidewall of the second mask layer. The method includes removing the protection layer and the first portion of the first mask layer. The first mask layer exposes a second portion of the film after the removal of the first portion of the first mask layer. The method includes removing the second portion of the film using the first mask layer and the second mask layer as an etching mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   forming an underlying layer over a substrate;
   forming a first mask layer a material including a polymer on a top surface of the underlying layer;
   forming a second mask layer including photoresist on the first mask layer;
   performing a concurrent plasma etching and deposition process, wherein the concurrent plasma etching and deposition process includes etching the first mask layer while forming a protection layer on a first sidewall of the second mask layer, wherein the etching the first mask layer includes exposing the underlying layer and wherein the protection layer interfaces the underlying layer;
   subsequently to the etching, removing the protection layer; and
   after removing the protection layer, etching the underlying layer on the substrate using the etched first mask layer and the second mask layer as an etching mask.

2. The method of claim 1, wherein the removing the protection layer is performed by a dry etching process.

3. The method of claim 1, wherein the protection layer is comprised of a polymer.

4. The method of claim 1, wherein the concurrent plasma etching and deposition process uses a processing gas comprising including carbon and fluorine.

5. The method of claim 1, wherein the concurrent plasma etching and deposition process uses a processing gas comprising including $CHF_3$, $CH_2F_2$, $CH_3F$, or a combination thereof.

6. The method of claim 1, wherein etching the underlying layer forms a masking element.

7. The method of claim 6, further comprising: using the masking element while etching a semiconductor gate layer under the etched underlying layer.

8. The method of claim 1, wherein etching the first mask layer while forming the protection layer on the first sidewall of the second mask layer forms the protection layer on a sidewall of the etched first mask layer.

9. The method of claim 1, wherein the etching the first mask layer forms a tapered sidewall of the etched first mask layer.

10. The method of claim 1, further comprising
    forming the underlying layer by depositing a hard mask material over the substrate and under the first mask layer;

forming a semiconductor layer over the substrate, wherein the hard mask material is formed over the semiconductor layer; and after the etching of the underlying layer, removing an exposed portion of the semiconductor layer.

11. A method for forming a semiconductor device structure, comprising:

forming an antireflective layer having a first thickness on a substrate having a plurality of layers;

forming a mask feature over a first region of the antireflective layer;

using a plasma process to form a second region of the antireflective layer at a second thickness less than the first thickness, while maintaining the mask feature over the first region;

during the plasma process etching the second region of the antireflective layer to the second thickness and depositing a polymer layer on sidewalls of the mask feature and sidewalls of the first region of the antireflective layer, the polymer layer on the sidewalls of the first region being disposed over the second region having the second thickness; and after the plasma process, etching at least one of the plurality of layers while using the mask feature as a masking element.

12. The method of claim 11, wherein the polymer layer is disposed on a tapered sidewall of the first region of the antireflective layer.

13. The method of claim 12, wherein the polymer layer continuously covers the sidewalls of the mask feature and the tapered sidewall of the first region of the antireflective layer.

14. The method of claim 11, wherein the plasma process etching uses a processing gas comprising $CHF_3$, $CH_2F_2$, $CH_3F$, or a combination thereof.

15. The method of claim 11, further comprising:

before the etching at least one of the plurality of layers while using the mask feature as a masking element, removing the polymer layer.

16. A method for forming a semiconductor device structure, comprising:

forming an underlying film over a substrate;

forming a first mask layer over the underlying film;

forming a feature of a second mask layer over the first mask layer;

performing a plasma etching and deposition process to reduce a thickness of a first portion of the first mask layer not covered by the second mask layer while forming a protection layer on a first sidewall of the feature of the second mask layer and a second sidewall of the first portion of the first mask layer;

stopping the plasma etching and deposition process at a first thickness of the first portion of the first mask layer, wherein the first thickness is greater than zero; and performing another etching process on the first portion of the first mask layer having the first thickness to form a feature of the first mask layer.

17. The method of claim 16, further comprising: removing the protection layer.

18. The method of claim 17, further comprising: etching the underlying film while using the feature of the second mask layer and the feature of the first mask layer as masking elements.

19. The method of claim 16, wherein the performing the plasma etching and deposition process includes using a processing gas of $CHF_3$, $CH_2F_2$, or $CH_3F$.

20. The method of claim 16, wherein the performing the plasma etching uses a processing gas of $CHF_3$.

* * * * *